United States Patent
Leung et al.

(10) Patent No.: US 7,514,774 B2
(45) Date of Patent: Apr. 7, 2009

(54) STACKED MULTI-CHIP PACKAGE WITH EMI SHIELDING

(75) Inventors: Lap Wai Leung, Hong Kong (HK); Yu-Chih Chen, Hong Kong (HK); Man-Lung Sham, Hong Kong (HK); Chang-Hwa Chung, Hong Kong (HK)

(73) Assignee: Hong Kong Applied Science Technology Research Institute Company Limited, Shatin, New Territories (HK)

( * ) Notice: Subject to any disclaimer, the term of this patent is extended or adjusted under 35 U.S.C. 154(b) by 1 day.

(21) Appl. No.: 11/521,753

(22) Filed: Sep. 15, 2006

(65) Prior Publication Data
US 2008/0067656 A1    Mar. 20, 2008

(51) Int. Cl.
*H01L 23/02* (2006.01)
*H01L 21/00* (2006.01)

(52) U.S. Cl. .............. 257/686; 257/E23.085; 257/E25.023; 257/E23.004; 257/E23.092; 257/668; 257/685; 257/723; 257/724; 257/725; 257/728; 257/691; 257/778; 257/777; 257/738; 257/737

(58) Field of Classification Search .......... 257/686, 257/E23.085, E25.023, E23.004, E23.092, 257/668, 691, 777, 723, 724, 725, 728, 778, 257/734, 737, 738, 784, 786; 438/109
See application file for complete search history.

(56) References Cited

U.S. PATENT DOCUMENTS

| | | | |
|---|---|---|---|
| 5,056,215 A | 10/1991 | Blanton | |
| 5,136,366 A | 8/1992 | Worp et al. | |
| 5,166,772 A | 11/1992 | Soldner et al. | |
| 5,233,504 A | 8/1993 | Melton et al. | |
| 5,796,170 A | 8/1998 | Marcantonio | |
| 6,734,539 B2 | 5/2004 | Degani et al. | |
| 7,279,786 B2 * | 10/2007 | Kim | 257/686 |
| 2005/0006745 A1 * | 1/2005 | Nishimura | 257/686 |
| 2007/0158813 A1 * | 7/2007 | Kim | 257/686 |
| 2007/0235856 A1 * | 10/2007 | Haba et al. | 257/697 |
| 2007/0278660 A1 * | 12/2007 | Han et al. | 257/698 |
| 2008/0020512 A1 * | 1/2008 | Karnezos et al. | 438/110 |

* cited by examiner

*Primary Examiner*—Alexander O Williams
(74) *Attorney, Agent, or Firm*—Wells St. John, P.S.

(57) ABSTRACT

A stacked multi-chip package with an EMI shielded component has first and second substrates mounted together by a grid array of metallic connecting nodes, such as a solder Ball Grid Array. Each substrate has a conductive plane associated with it. An electronic component is mounted between the first and second substrates and is surrounded by a group of the metallic connecting nodes that are also electrically connected to the conductive planes of both substrates to form a conductive Faraday cage about the component.

12 Claims, 4 Drawing Sheets

STACKED MULTI-CHIP PACKAGE WITH EMI SHIELDING

BACKGROUND TO THE INVENTION

1. Field of the Invention

The Invention relates to multi-chip packages and in particular to stacked multi-chip packages. More particularly, the invention relates to a stacked multi-chip package with EMI shielding to isolate a chip in the package from electromagnetic interference, or from causing electromagnetic interference, in other parts of the package.

2. Background Information

Electromagnetic interference (EMI), also known as radio frequency interference (RFI), is caused by electromagnetic radiation and is a significant consideration in electronic circuit design. Electromagnetic radiation is emitted by electronic circuits and components carrying changing electrical signals. There are three main techniques for ameliorating or eliminating EMI. The first technique is to physically separate sensitive components from the source of any electromagnetic radiation. The second technique is to use bypass or decoupling capacitors and filters to ground unwanted interference signals. And, the third technique is to shield the sensitive or EMI generating components with a Faraday cage or enclosure.

The current emphasis in electronic circuit design is towards smaller and more powerful devices. A significant amount of work is being done in the area of multi-chip packages in which multiple integrated circuit (IC) chips are tightly packed within a small package. Within such packages physical separation of sensitive equipment and sources of electromagnetic radiation is not practical and decoupling is only partially effective. Therefore, shielding is an important solution within these multi-chip packages.

The most popular form of shielding within current chip packages is through use of a conductive can to enclose the sensitive or EMI generating component. The component is mounted on an area of a supporting substrate with a ground plane beneath it and a metal box, or other shaped, can is mounted over the component to enclose the component in a conductive enclosure. However, metal cans of this type take up considerable space on the substrate surface and tended to be not very robust often dislodging from the substrate surface due to cyclic stress loading on the solder joints holding the can to the substrate. They also present an obstacle to the flow of molding epoxy and water vapor may accumulate within the can if the electrical equipment experiences a sudden change in environmental conditions.

SUMMARY OF THE INVENTION

Accordingly, is an object of the present invention to provide a stacked multi-chip package with an EMI shielded space for sensitive electronic or EMI generating component that must be isolated within the package.

In view of the forgoing, there is disclosed herein a stacked multi-chip package with an EMI shielded space comprising a first substrate having a first ground plane laminated between dielectric layers of the first substrate, an electronic component mounted of a first side of the first substrate layer and a second substrate having a second ground plane laminated between dielectric layers of the second substrate, wherein the first substrate is mounted to the second substrate by a grid array of metallic connecting nodes with the electronic component positioned between the substrates, and at least a group of the metallic connecting nodes surround the electronic component and are electrically connected to both the first ground plane and the second ground plane.

Preferably, the electronic component is encapsulated in a resin casing that is in contact with both the first substrate and the second substrate.

Preferably, the electronic component is an integrated circuit chip, and the chip has been thinned to a thickness of between 5 and 7 mils.

Preferably, the group of the metallic connecting nodes is electrically connected to both the first ground plane and the second ground plane by a plurality of corresponding plates through holes in the first substrate and in the second substrate.

Preferably, the metallic connecting nodes are solder balls.

More generally, there is disclosed herein a stacked electronic component package comprising a first substrate, a second substrate mounted to the first substrate, an electronic component positioned between the substrates, a first conductive plane associated with the first substrate, a second conductive plane associated with the second substrate, and a plurality of conductive nodes surrounding the electronic component and interconnected with both the first and second conductive planes.

Further aspects of the invention will become apparent from the following description.

BRIEF DESCRIPTION OF THE DRAWINGS

An exemplary form of the present invention will now be described by way of example only and with reference to the accompanying drawings, in which.

DESCRIPTION OF THE EXEMPLARY EMBODIMENTS

Figure 1:
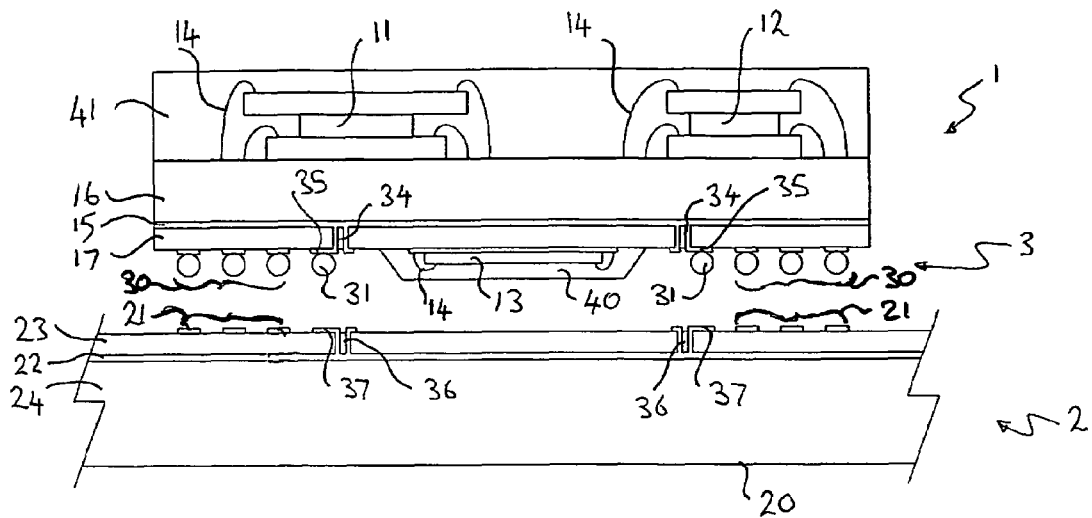
FIG. 1 is a cross-section depiction of an exemplary embodiment of a stacked multi-chip package having EMI shielding according to the invention.
Figure 2:
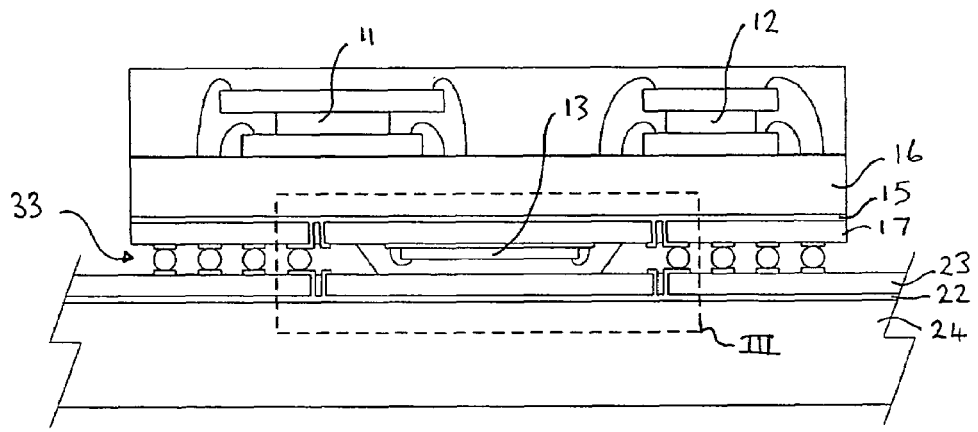
FIG. 2 is a second cross-section depiction of the stacked multi-chip package of FIG. 1.
Figure 3:
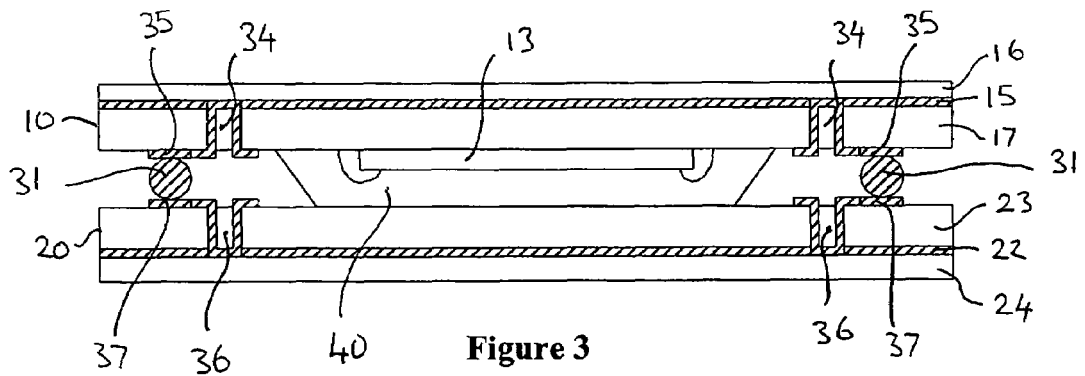
FIG. 3 is a cross-section depiction of the area III of FIG. 2.
Figure 4:
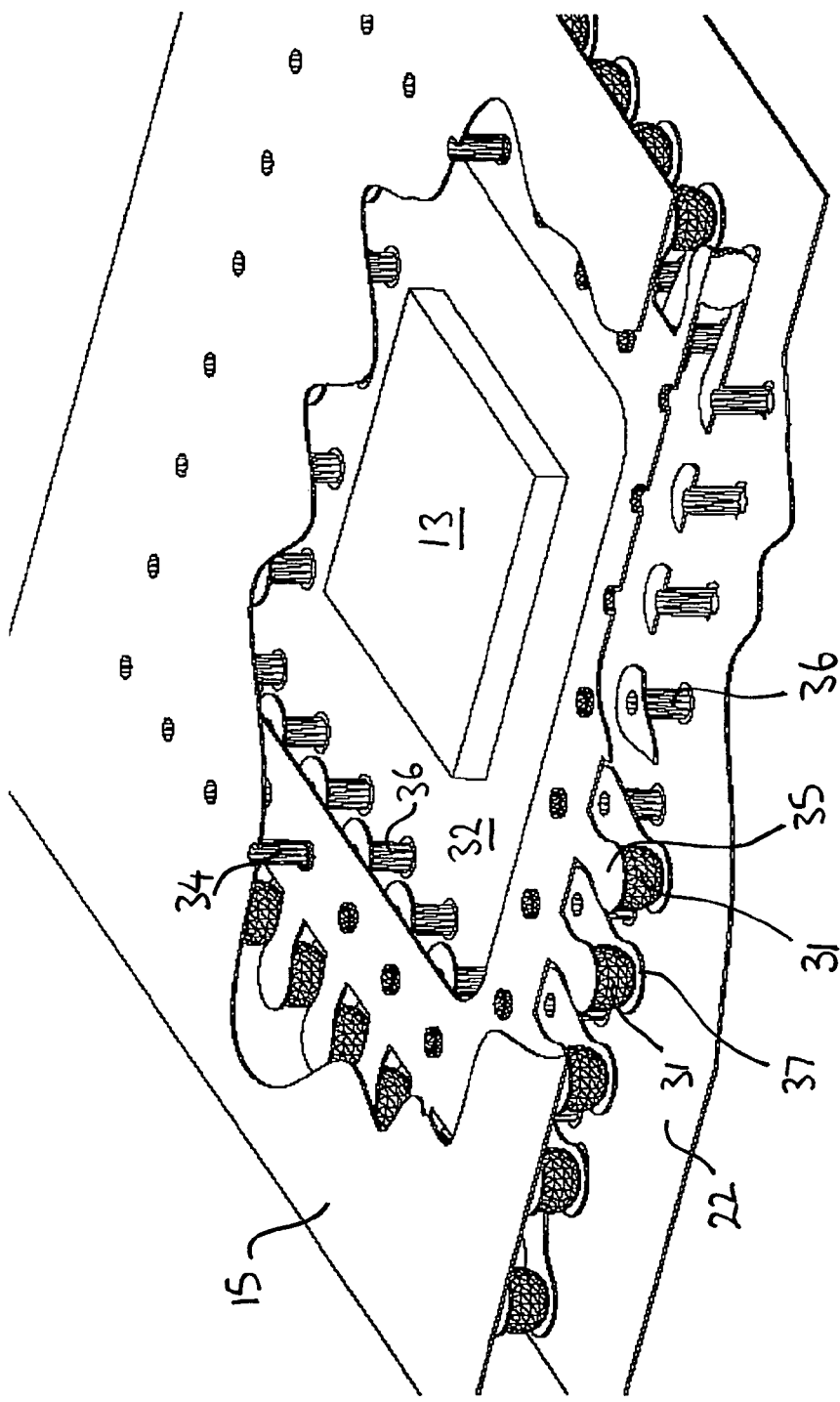
FIG. 4 is a cut-away perspective depiction of the EMI shielding cage.

In the specification and claims 1 mil=25.4 micrometer ($1 \times 10^{-6}$ m).

Generally the invention is a stacked multi-chip package with first and second substrates mounted together by a grid array of metallic connecting nodes, such as a solder Ball Grid Array. Each substrate has a ground plane laminated between dielectric layers of the substrate. A sensitive or EMI generating component is mounted between the first and second substrates and is surrounded by a group of the metallic connecting nodes that are also electrically connected to the ground planes of both substrates to form a conductive Faraday cage about the component.

In the drawings there is depicted an exemplary embodiment of the invention as practiced in a multi-chip integrated package having both radio frequency (RF) and digital integrated circuit (IC) chips packaged together in a stacked substrate arrangement. This type of arrangement is often termed a stacked multi-chip module (MCM). This exemplary example is not however intended to limit the scope of use or functionality of the present invention. Those skilled in the art will appreciate that aspects of the invention may be practiced with other types of stacked substrate arrangements where it is desirable to isolated one or more component from noise interference in, or from introducing noise interference into, other parts of the package. Further, the exemplary embodiment is a single stack package having a single interconnecting support substrate bonded to a system substrate or motherboard. The skilled artisan will appreciate that the invention applies equally to multi-stack substrates and could be used between two or more interconnected substrates separately from the system substrate. A particular IC chip configuration is also described to illustrate the invention, and this is also not intended to limit the scope of use or functionality of the invention. Other chip types, components and/or their combinations may be used with the invention. The invention applies generally to any sensitive electronic or EMI generating component that must be isolated within a layered substrate package.

Referring to the drawings generally, in the exemplary embodiment a MCM 1 is mounted to a main system board, or motherboard 2, and interconnected thereto by a Ball Grid Array (BGA) 3. The MCM 1 comprises a supporting substrate 10 having two digital IC chips 11, 12 mounted on its first side and an RF chip 13 mounted on its second side. The digital IC chips 11, 12 are a memory chip and a logic chip for controlling the RF module 1. The RF chip 13 must be thin enough to mount in the BGA 3 stand-off space 33 between the RF module 1 and the main board 2. A typical RF chip is 15-25 mils thick: too think for a robust BGA stand-off distance. However, chips can be thinned to between 5-7 mils. Thinning of chips is conventional in the art of IC technology and manufacture. The RF module supporting substrate 10 has printed circuits on one or more of its surfaces and bonding pads for mounted the chips 11, 12, 13 to the supporting substrate 10 in known manner using interconnect wires 14. The digital IC and RF chips 11, 12, 13 are interconnected by plated through-holes (vias) in the substrate. The printed circuits and chip interconnect vias are not critical to the current invention and so are not shown for clarity.

Figure 5:
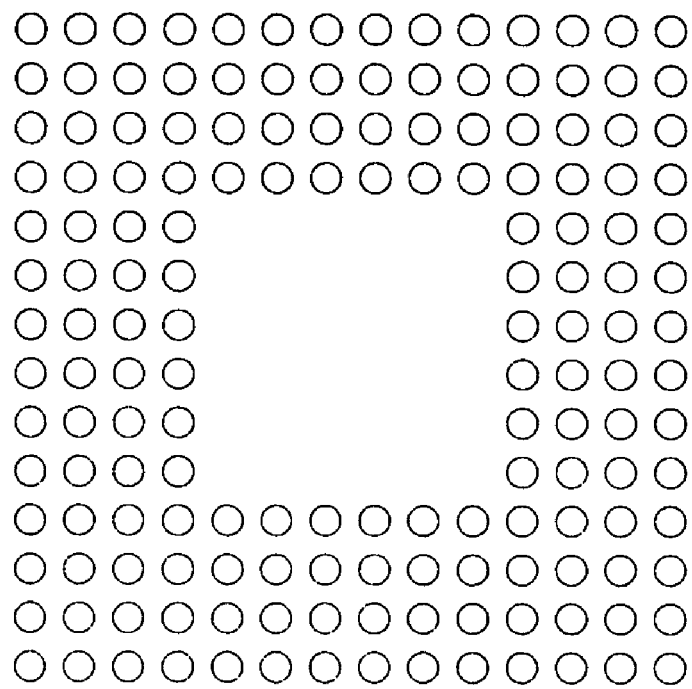
FIG. 5 is a depiction of a typical Ball Grid Array footprint.
Figure 6:
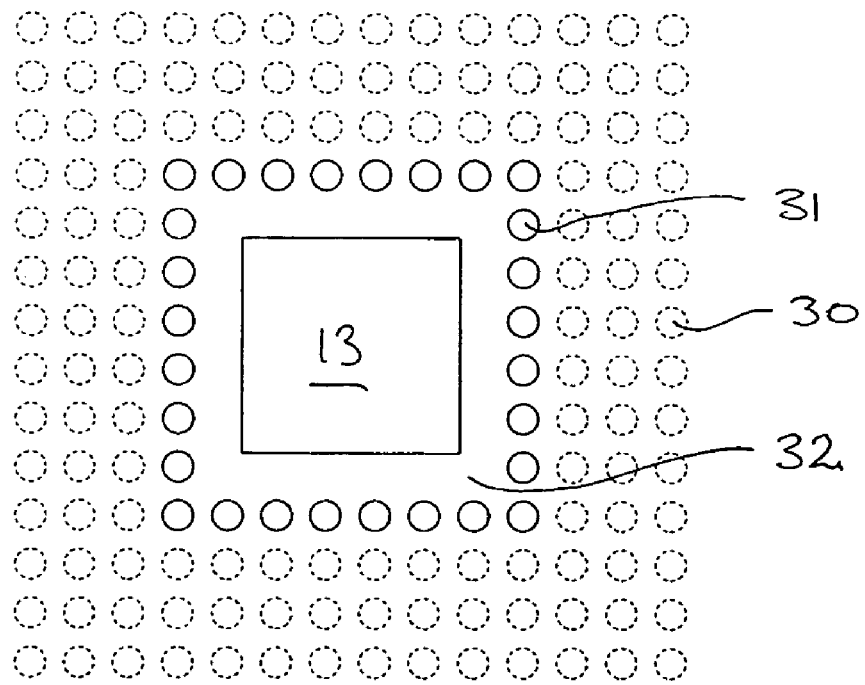
FIG. 6 is a depiction of the Ball Grid Array footprint used in the exemplary embodiment.

The RF module supporting substrate 10 is of a type having one or more conductive ground planes 15 laminated between dielectric layers 16, 17 of epoxy or other suitable non-conductive material. Substrates of this type are conventional in the art of printed circuit board technology and manufacture. The module substrate 10 is mounted and interconnected to the system substrate 20 by the Ball Grid Array (BGA) 3. On the second side of the RF module substrate 10 surrounding the RF chip 13 is a plurality of balls of solder 30, 31 arranged in a grid pattern. A typical BGA grid pattern is shown in FIG. 5. Referring to FIG. 6, in a BGA 3 according to the invention the inner most solder balls 31 (shown in solid lines in FIG. 6) that form the perimeter of the RF chip space 32 are electrically connected to the ground plane 15 within the module substrate 10. This electrical connection is provided by ground plane vias 34 between the second surface of the substrate 10 and the ground plane 15. The ground plane vias 34 are connected with via bonding pads 35 or under bump metallization (UBM) solder on the second side of the module substrate 10 to which the inner perimeter of solder balls 31 are attached.

The surface of the system substrate 20 to receive the RF module 1 is provided with electrical bonding pads 21, 37 or UBM points arranged in a corresponding grid pattern to receive the solder balls 30, 31 of the Ball Grid Array 3 of the RF module 1. At the center of the bonding pad 21, 37 grid pattern is a corresponding RF chip space. The system substrate 20 is also of a type having one or more conductive ground planes 22 laminated between dielectric layers 23, 24. The inner most line of bonding pads 35 that form the perimeter of the system substrate RF chip space is electrically connected to the system substrate ground plane 22 in the same way as the inner perimeter of solder balls 31 on the module support substrate 10. That is, ground plane vias 36 are formed between the inner perimeter bonding pads 37 of the system substrate and its ground plane 22. Accordingly, when the RF module 1 is mounted to the system substrate 2, in known manner, via the Ball Grid Array 3 a type of Faraday cage is provided about the RF chip 13 for EMI Shielding of the chip. The Faraday cage comprises upper and lower ground planes 15, 22 of the RF module substrate 10 and the system substrate 20 interconnected around a shielded chip space 32 by a plurality of ground plane vias 34, 36 and the inner perimeter of BGA solder balls 31. The remaining solder balls 30 (shown in dashed lines in FIG. 6) of the BGA 3 provide electrical interconnection between the RF module 1 and the system 2 in known manner. This electrical interconnection between the RF module 1 and the system 2 is electrically isolated from the ground planes 15, 22 of the module and system substrates 10, 20.

The Faraday cage provides a grounded conductive enclosure around the RF chip 13 to protect it from electrical and EMI interference caused by nearby digital chips 11, 12 and changing electrical signals. Although there are gaps between the inner perimeter solder balls 31 forming the sides of the cage these will not substantially affect the shielding effectiveness of the cage as electromagnetic waves do not penetrate very far through holes that have dimensions less than their wavelength. Most modern electronic devices such as mobile phones, wireless network adaptors and telecommunications equipment operate in the Ultra High Frequency (UHF) band from 300 MHz to 10 GHz. This is a wavelength range of 1 meter to 100 millimeters. Typically, the gaps between solder balls 31 will be just a few hundreds micrometers, much less than the wavelength of the EMI waves, which will therefore generally not pass through the gaps between solder balls 31.

To make the design more robust to vibration in use the chips and interconnect wires are overmolded in epoxy casings 40, 41. This is conventional in circuit board and MCM assembly and methods are known in the art. In the current invention, however, the RF chip 13, or other component, being shielded is located in the BGA stand-off space 33 between the substrates 10, 20. The thickness of the epoxy mold 40 encapsulating the RF chip 13 is therefore controlled and trimmed to act as a spacer for the BGA stand-off 33. The epoxy mold 40 of the RF chip 13 is in contact with the system substrate 20 to help support the module substrate 10 which prevents the BGA solder balls 30, 31 from collapsing during the reflow heating process. During the solder printing process, the volume of solder paste on each molding pad may be increased to enhance the tolerance to variations in solder ball height and substrate warpage.

It should be appreciated that modifications and alternations obvious to those skilled in the art are not to be considered as beyond the scope of the present invention. For example a Ball Grid Array interconnection is used between the stacked substrates, however, it will be apparent to the skilled artisan that a Pin Grid Array (PGA), Land Grid Array (LGA) or other grid type interconnection system that can surround a shielded space between interconnected substrates may be used.

Figure 7:
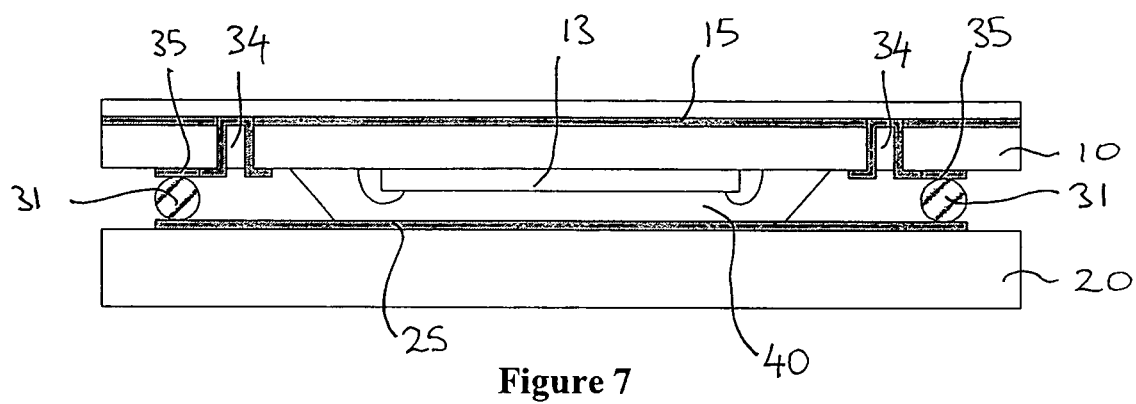
FIG. 7 is a depiction of a first variation of the exemplary embodiment.
Figure 8:
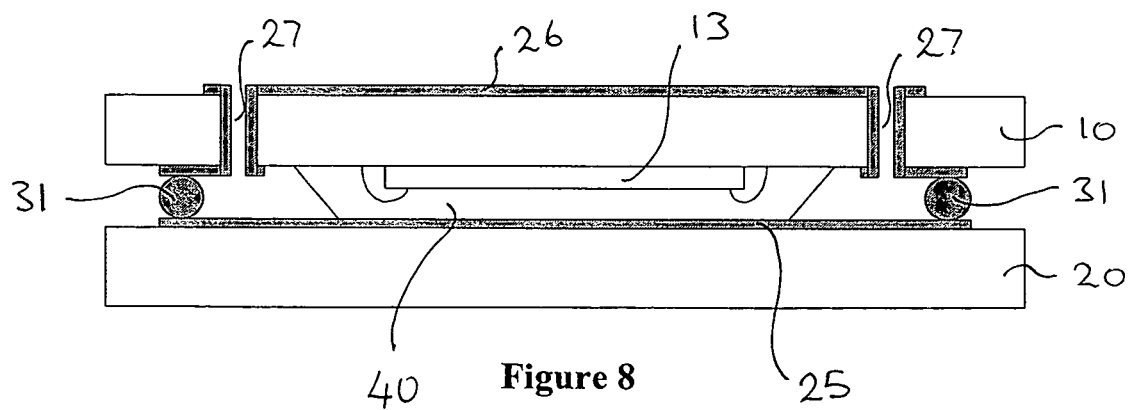
FIG. 8 is a depiction of a second variation of the exemplary embodiment.

In the exemplary embodiment the upper and lower conductive surfaces of the shielding cage; that is to say the Faraday cage; are provided by ground planes 15, 22 of the substrates. However, it should be understood that these conductive planes need not extend throughout the entire area of the substrate nor be laminated between layers of the substrate. Referring to FIG. 7, a large conductive plane or pad 25 may be formed on the surface of one of the substrates, for example the system substrate 20, for receiving the inner perimeter solder balls 31 and forming one side of the shielding cage. Additionally, referring to FIG. 9, a similar conductive plane or pad 26 may be formed on an opposite side of the substrate mounting the shielded electronic component and connected to the solder balls 31 by plated through-holes 27.

What is claimed is:

1. An electronic device having a multiple chip module in combination with a main system board forming an EMI shielded space for one of the chips:
   the multiple chip module comprising:
      a first substrate having a first side, a second side and a first ground plane laminated between dielectric layers of the first substrate,
      a first chip mounted on the first side of the first substrate,
      a second chip mounted on the second side of the first substrate and electrically connected with the first chip,
      a first array of bonding pads located on the first side of the first substrate and surrounding the first chip, at least a portion of the array of bonding pads forming a perimeter around the first chip connected with the first ground plane,
   the main system board comprising:
      a second substrate having a mounting side and a second ground plane laminated between dielectric layers of the second substrate, and
      a second array of bonding pads, complementary to the first array of bonding pads, located on the mounting side of the second substrate and a complimentary portion of the second array of bonding pads connected with the second ground plane,
   wherein the first substrate is mounted to the second substrate by a grid array of metallic connecting nodes adjoining the first and second arrays of bonding pads with the first chip located between the first and second substrates such that the ground planes and portions of the arrays of bonding pads connected with the ground planes form a conductive shield about the first chip.

2. The electronic device of claim 1 wherein the first chip is encapsulated in resin that is in contact with both the first substrate and the second substrate.

3. The electronic device of claim 1 wherein the first chip is an integrated RF chip.

4. The electronic device of claim 3 wherein the first chip has been thinned to a thickness of between 5 and 7 mils.

5. The electronic device of claim 1 wherein the portions of the first and second arrays of bonding pads are electrically connected to both the first ground plane and the second ground plane by a plurality of plated through-holes in the first substrate and in the second substrate respectively.

6. The electronic device of claim 1 wherein the metallic connecting nodes are solder balls.

7. The electronic device of claim 1 wherein the first and second substrates mechanically support and electrically connect a plurality of electronic components.

8. The electronic device of claim 1 wherein the plurality of conductive nodes are part of a Ball Grid Array mounting the second substrate to the first substrate.

9. The electronic device of claim 1 wherein at least one of the conductive planes is a conductive pad located on a surface of one of the substrates.

10. The electronic device of claim 9 wherein the conductive pad is located on a surface of the second substrate opposite the first chip.

11. The electronic device of claim 1 wherein the second chip is a control chip for controlling the first chip.

12. The electronic device of claim 1 wherein the first or second chip is electrically connected with a the main system board by a second portion of the arrays of bonding pads.

* * * * *